(12) United States Patent
Flautner et al.

(10) Patent No.: US 7,863,733 B2
(45) Date of Patent: Jan. 4, 2011

(54) INTEGRATED CIRCUIT WITH MULTIPLE LAYERS OF CIRCUITS

(75) Inventors: Krisztian Flautner, Ann Arbor, MI (US); Robert Campbell Aitken, San Jose, CA (US); Stephen John Hill, Cambridge (GB)

(73) Assignee: ARM Limited, Cambridge (GB)

( * ) Notice: Subject to any disclaimer, the term of this patent is extended or adjusted under 35 U.S.C. 154(b) by 428 days.

(21) Appl. No.: 12/007,480

(22) Filed: Jan. 10, 2008

(65) Prior Publication Data

US 2009/0015322 A1    Jan. 15, 2009

Related U.S. Application Data

(60) Provisional application No. 60/959,046, filed on Jul. 11, 2007.

(51) Int. Cl.
*H01L 21/00* (2006.01)
*H01L 21/82* (2006.01)
*H01L 23/02* (2006.01)
*H01L 23/34* (2006.01)

(52) U.S. Cl. ............... 257/723; 257/686; 257/E23.152; 257/E23.169; 257/E23.171; 257/E23.175; 257/E21.598; 438/109; 438/129; 438/130

(58) Field of Classification Search ................. 257/723, 257/686; 438/109, 129, 130
See application file for complete search history.

(56) References Cited

PUBLICATIONS

Lea et al., "A 3-D Stacked Chip Packaging Solution for Miniaturized Massively Parallel Processing," (1999), 9 pgs.
Black et al., "Die Stacking (3D) Microarchitecture," 11 pgs.

*Primary Examiner*—David A Zarneke
(74) *Attorney, Agent, or Firm*—Nixon & Vanderhye P.C.

(57) ABSTRACT

An integrated circuit 78 is formed of multiple layers of circuits 14, 16 superimposed to produce stacks of circuit blocks 2, 4. Stack control circuitry 18, 20 is associated with the input and output signals from the circuit blocks to direct these to/from the currently active circuit block(s) as appropriate. The superimposed circuit blocks 2, 4 provide redundancy for each other, both for manufacturing defect resistance and for operational redundancy, such as providing multiple modular redundancy in safety critical environments.

25 Claims, 7 Drawing Sheets

| Layer | F=F₁ P@F₁ | F=F₂ P@F₂ |
|---|---|---|
| 0 | ✓ 1.5 | ✗ |
| 1 | ✓ 1.8 | ✗ |
| 2 | ✓ 3.6 | ✓ 3.8 |
| 3 | ✓ 2.0 | ✓ 4.0 |

INTEGRATED CIRCUIT WITH MULTIPLE LAYERS OF CIRCUITS

CROSS-REFERENCE TO RELATED APPLICATION

This application claims priority to U.S. Provisional Patent Application Ser. No. 60/959,046, filed 11 Jul. 2007, the entire contents of that application is hereby incorporated by reference in its entirety.

BACKGROUND OF THE INVENTION

1. Field of the Invention

This invention relates to the field of integrated circuits. More particularly, this invention relates to integrated circuits formed of multiple layers of circuits.

2. Description of the Prior Art

As the process size with which integrated circuits are manufactured has become smaller fault tolerance is becoming increasingly important factor in integrated circuit design. Furthermore, there is an increased problem of post-manufacture (field) failures of integrated circuits due to wear out caused by electromigration and oxide breakdown (among other factors). These failures are made worse by the difficulties related to manufacture-time burn-in; it is increasingly difficult to over-stress integrated circuits at manufacture-time to find integrated circuits that are likely to fail early in the field as such techniques incur too many false positives causing excessive yield loss. A further factor is the increasing uncertainty associated with manufactured structures: it is becoming increasingly difficult to be confident that measurement/test conditions are sufficiently like operating conditions to give valid information such that subsequent failures are often due to variability rather than any particular break-down effect.

It has been proposed to apply fault tolerance techniques more extensively within integrated circuits in order to render them more robust against the above types of problem. However, such traditional fault tolerance techniques require significant modification of the integrated circuit architecture of many designs representing a significant and disadvantageous cost. Furthermore, the use of such fault tolerance techniques (such as triple modular redundancy) tends to be expensive in the terms of the associated circuit overhead.

SUMMARY OF INVENTION

Viewed from one aspect the present invention provides an integrated circuit having a major plane, said integrated circuit comprising: a plurality of layers of circuits, said plurality of layers of circuits sharing a corresponding layout of a plurality circuit blocks over at least a portion of said layer, said plurality of layers being superimposed such that over said portions are formed a plurality of stacks of circuit blocks extending perpendicular to said major plane; wherein each of said plurality of stacks is coupled to stack control circuitry configured to receive one or more input signals to said stack, to supply said one or more input signals to one or more active circuit blocks within said stack, to receive output signals of said one or more active circuit blocks and to form one or more output signals of said stack.

The present technique recognises that by using a three dimensional integration technique whereby a plurality of layers of circuits with a corresponding layout are superimposed this permits redundant circuits to be located directly above or below the circuits for which they are providing redundancy. The circuit blocks within a stack will normally be substantially identical or at least provide the same signal interface and functionality so as to be able to substitute for one another. This physical location within a stack of circuits allows for a relatively easy retrofit into existing architectures and designs and provides an advantageously low signal routing overhead associated with the use of the redundant circuit blocks when needed.

It will be appreciated that the layers of circuits could be completely identical, such as having been manufactured using the same mask. However, it is also possible that the layers of circuits could have some differences with only the portions of those layers having a corresponding layout such that circuit blocks within those portions form stacks of substantially identical circuit blocks which can provide redundancy for one another. The corresponding layouts may be directly identical layouts or mirror image layouts permitting the superimposing of the layers of circuits to form the stacks.

The stack control circuitry may be responsive to one more selecting signals to select an active circuit block within a stack with the remainder of the circuit blocks within the stack being inactive and the stack control circuitry routing signals to and from the active circuit block. This arrangement with only one circuit block within the stack being active provides fault-tolerance redundancy; if a circuit block is faulty at manufacture, or develops a fault in the field, then it can be replaced by another of the circuit blocks within the stack.

The above technique recognises that when a complex integrated circuit is manufactured there are a high number of instances of the integrated circuit (layer of circuits) in which errors are present within one or more of the circuit blocks but the other circuit blocks within that integrated circuit are properly functional. Such an integrated circuit (layer of circuits) would normally be scrap and have no use, but the present technique recognises that by superimposing this scrap layer of circuits on another layer of circuits, the working circuit blocks within the layer of circuits which would otherwise be scrap can provide redundancy for the other layer of circuits at a relatively low cost It may be that neither of the layers of circuits used is fully defect free and each includes at least one defective block of circuits but that each stack of circuit blocks contains at least one non defective block enabling a work integrated circuit to be produced out of what would otherwise be two scrap integrated circuits.

The present technique may be used for purposes other than merely repairing defective circuit blocks. The characteristics used to select which circuit block within a stack is to be used may extend beyond merely whether or not a circuit block is defective. For example, the circuit blocks within a stack could be tested at manufacture time for their speed and/or power consumption and a selection made as to which circuit block is to be active so as to improve the speed and/or power consumption characteristics of the overall integrated circuit. It may be that one circuit block within the stack is most appropriate to use when high speed operation is the priority whereas another circuit block may be more appropriate to use when the priority is low power consumption and a lower speed is sufficient. The selection of which circuit block within a stack is active can accordingly be dynamic and made at run time compared with a static configuration fixed, for example, as a part of manufacturing test operations.

The selecting signals used to configure the stack control circuitry can be provided and stored in a number of different ways. A static configuration may use programmable fuses which are fixed at manufacture time. A more dynamic arrangement can use a programmable register. Such a programmable register could be initially programmed at manufacture time and updated during use dependent upon sensed characteristics of the integrated circuit. A dedicated configuration processor may be provided on the integrated circuit for the purpose of generating appropriate selection controlling signals for the stack control circuitry, and for other control purposes relating to the present technique.

In the context of the dynamic determination of which circuit block within a stack should be used, other embodiments may use wear out detecting circuitry to detect if a circuit block is close to its failure point due to wear out and accordingly make a switch to another non-defective circuit block within a stack. The circuit blocks within a stack may also include within them error detecting and correcting circuits, such as timing speculation control circuits and error recovery circuits for use when speculative timing fails. The provision of such circuits is advantageous in assisting in coping with the timing variations that can be introduced by the need to move signals between the layers of circuits in accordance with the present techniques, even though these are relatively close together, and can also be used to detect when an excessive number of errors need to be corrected within a given circuit block indicating that it is desirable to switch to using another circuit block within the stack as the active circuit block.

It will be appreciated that the stack control circuitry has an important role within the present technique. In order to increase the robustness of such stack control circuitry to errors in its operation resulting from manufacturing defects, the stack control circuitry may be manufactured using larger and more robust components than are used for the circuit blocks within the stacks. The stack control circuitry will typically be relatively small and accordingly the use of larger components in forming this stack control circuitry will not represent a significant area increase. The stack control circuitry might also be formed from circuit component (gates etc) using more robust threshold voltages for switching and/or operating at higher voltage levels less susceptible to error, at the cost of a small increase in power consumption and/or reduction in speed within the stack control circuitry itself.

It will be appreciated that while the circuit blocks within a stack are functionally equivalent such that they can be switched in and out as replacements for one another they may not be completely identical. It may be that their non identical nature is the result of manufacturing variation between the circuit blocks or it may be that the different circuit blocks within the different layer of circuits are manufactured with different sets of parameters, such as one layer of circuits using a different more conservative threshold voltage than another, whilst being physically the same size and shape. Such an arrangement could provide a slow but low power layer of circuits in combination with a fast but high power layer of circuits and the ability to switch between these two layers of circuits depending upon what type of operation is currently required.

The above has discussed the action of the stack control circuitry in the context of one circuit block within the stack being active at any given time. It is also possible to use the present techniques to provide an integrated circuiting in which multiple circuit blocks within a stack are active at the same time and provide multiple modular redundancy with respect to each other. Such systems are strongly advantageous in critical operating environments, such as aviation and safety systems. Within such environments it is important that if an error arises operation of system can continue and the error can be identified and isolated. Multiple modular redundancy, such as triple modular redundancy, is a known technique within such environments typically requires specific, bespoke and expensive systems and architectures to be developed in order to achieve such characteristics. The present technique provides a relatively simple and inexpensive way of achieving multiple modular redundancy with the re-use of a substantially unaltered integrated circuit design by the superimposition of multiple layers of circuits such that within a stack of circuit blocks multiple circuit blocks can be simultaneously active and their processing results compared to detect and correct for errors within their operation.

The multiple modular redundancy techniques can apply a voting technique within the stack control circuitry such that if an error arises within an output signal produced by one of the circuit blocks, then this will be overruled by the correct output signal being produced by the majority of the circuit blocks within the stack. The voting circuitry can be provided within the stack control circuitry itself, within each layer of circuits with the voting circuitry being active in one of the circuit layers and inactive in the others, or the voting circuitry may be provided in a separate layer of circuits interposed between the layers of circuits containing the circuit blocks forming the stack or to one side of those circuit blocks forming a stack. It is also possible to use techniques such as limited current output drivers for each circuit block such that when the output signals generated by each circuit block are connected together an erroneous output signal will be overpowered by the remaining correct output signals.

Whilst triple modular redundancy including three layers of circuits and three circuit blocks within each stack provides a well accepted and understood level of protection, it may also be possible to provide double modular redundancy with two circuit blocks within each stack and operating such that the output signal produced more rapidly is judged to be the correct signal when the two output signals disagree.

The present technique may also be used to provide soft error protection by arranging state holding elements within the stacks and providing for voting between the output signals representing the state held within those state holding elements. In this way, a soft error within one of the state holding elements is highly unlikely to be accompanied by a soft error in another of the state holding elements within the same stack, such that the correct result will be produced by the voting mechanism. Additionally, the incorrect state value being stored as a result of the soft error can be corrected by the voting mechanism back to the proper value such that further operation will continue normally.

Whilst the above soft error protection technique could be provided for every state holding element, such as every memory cell within a memory, it may also be used more selectively to provide a good deal of soft error protection with a significantly reduced level of overhead by protecting only strategic state holding elements, such as the register file within a microprocessor, the input and output buffers from a memory system or integrated circuit.

The layers of circuits which are superimposed upon each other can be linked together in a variety of different ways. These include the use of cross-die wires, silicon bumps and capacitive coupling. Other techniques are also possible.

The way in which a layer of circuits is broken down into circuit blocks which are to be provided with associated stack control circuitry and are to form a stack can vary. At one level within a system-on-chip integrated circuit the high level system components can be considered as the circuit blocks and provide redundancy for one another within a stack. The relative isolation of such system components from one another, and the well defined interfaces between such system components, are well suited to the present techniques since the stack control circuitry can be located at these well defined interfaces.

At a lower architecture level, a circuit architect may divide the layer of circuits into circuit blocks in ways including dividing processing pipeline stages, dividing function units within a processor or dividing between registered signals at a fine grained level. It will be appreciated that dividing the layers of circuits in these different ways will have different advantages and different disadvantages depending upon the desired target use.

Viewed from another aspect the present invention provides, a method of forming an integrated circuit having a major plane, said method comprising the steps of: superimposing a plurality of layers of circuits, said plurality of layers of circuits sharing a corresponding layout of a plurality circuit blocks over at least a portion of said layer, such that over said portions are formed a plurality of stacks of circuit blocks extending perpendicular to said major plane; and providing stack control circuit coupled to said stack to receive one or more input signals to said stack, to supply said one or more input signals to one or more active circuit blocks within said stack, to receive output signals of said one or more active circuit blocks and to form one or more output signals of said stack.

Viewed from a further aspect a method of forming an integrated circuit having a major plane, said method comprising the steps of: superimposing a plurality of layers of circuits, said plurality of layers of circuits sharing a corresponding layout of a plurality circuit blocks over at least a portion of said layer, such that over said portions are formed a plurality of stacks of circuit blocks extending perpendicular to said major plane; and providing stack control circuit coupled to said stack to receive one or more input signals to said stack, to supply said one or more input signals to one or more active circuit blocks within said stack, to receive output signals of said one or more active circuit blocks and to form one or more output signals of said stack.

BRIEF DESCRIPTION OF THE DRAWINGS

Embodiments of the invention will now be described, by way of example only, with reference to the accompanying drawings in which.

DESCRIPTION OF THE PREFERRED EMBODIMENTS

Figure 1:
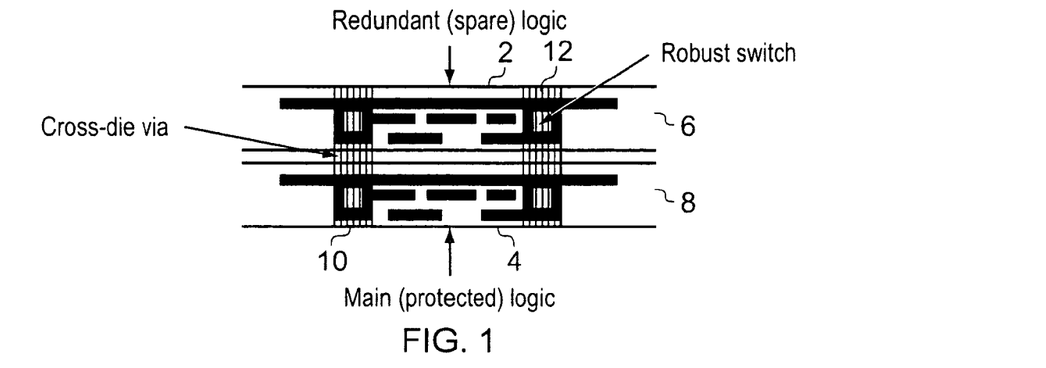
FIG. 1 schematically illustrated a portion of an integrated circuit including a main circuit block and a redundant (spare) circuit block within a stack of circuit block.

FIG. 1 schematically illustrates two circuit blocks 2, 4 which have a substantially identical form and functionality. It will be appreciated that the two circuit blocks 2, 4 may vary slightly due to manufacturing variations or may vary more markedly such as through the use of different manufacturing parameters, such as being manufactured to have different threshold switching voltages or with different doping characteristics, but physically with the same size components. The physical correspondence between the two circuit blocks 2, 4, and the corresponding layouts of the layers of circuits 6, 8 within which they are formed, enable the layers of circuits 6, 8 to be superimposed such that the circuit blocks 2, 4 are adjacent one another and form a stack. A cross-die via 10 is used to link together points at which input signals pass into the circuit blocks 2, 4 and a further cross-die via 12 can be used to link together points at which output signals leave the circuit blocks 2, 4. Associated with these cross-vias wires are "robust" switches which form stack control circuitry, or at least part thereof. These switches can be robust in the sense that they are manufactured of physically larger gates and accordingly are less prone to manufacturing defect; operate with different threshold voltages; or having other characteristics making them more reliable.

Figure 2:
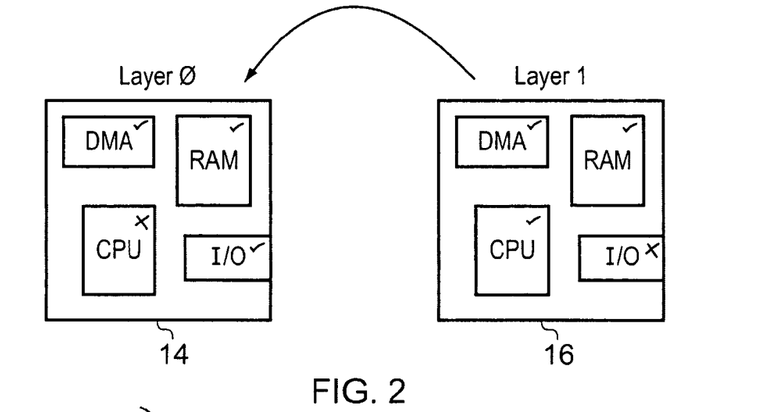
FIG. 2 schematically illustrates two layers of circuits suitable for superimposition.

FIG. 2 illustrates two layers of circuits 14, 16. These two layers of circuits 14, 16 have a corresponding layout enabling one layer 16 to be placed over the other layer 14 such that the individual circuit blocks within the layers of circuits 14, 16 lie adjacent each other and can be linked by appropriate stack control circuitry and linking mechanisms, such as, for example, cross-die vias, capacitive coupling or solder bumps.

In the example of FIG. 2 it will be seen that each of the layers includes one defective circuit block, as indicated by the cross, with the remaining circuit blocks being non-defective, as indicated by the tick. Both of the layers of circuits 14, 16 are non functioning on their own and would be scrap on their own. However, between the two layers of circuits 14, 16 they do process one none defective circuit block within each stack when they are superimposed and accordingly can produce one functioning integrated circuit from what otherwise would be two layers of circuits 14, 16. Thus, the functioning CPU in layer 1 16 provides redundancy for the defective CPU in layer 0 14 while the functioning input/output unit of layer 14, provides redundancy for the defective input/output unit of layer 1 16. The bus architecture connecting the circuit blocks of FIG. 2 can be provided with a three dimensional form so as to facilitate the connections between layers 14, 16 at the bus interconnect level.

Figure 3:
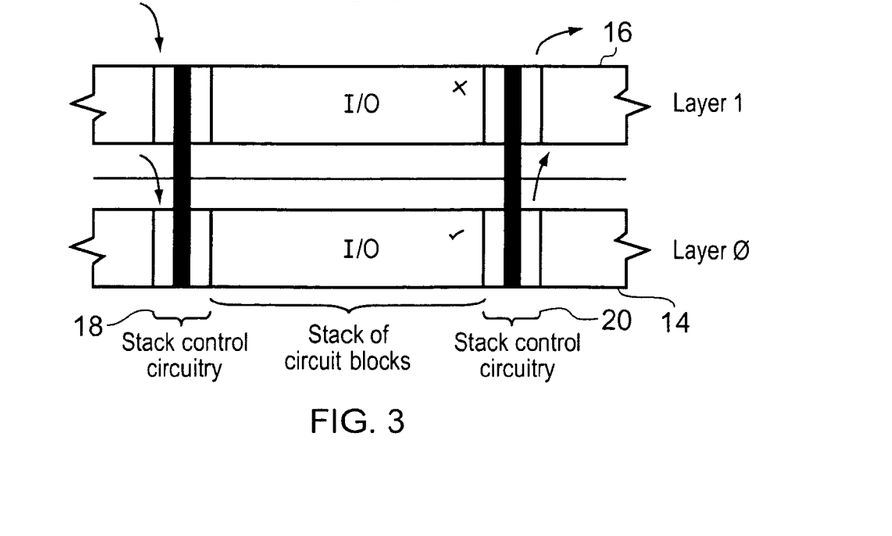
FIG. 3 schematically illustrates the role of the stack control circuitry in substituting a functioning circuit block for a defective circuit block within a layer of circuits.

FIG. 3 illustrates how the redundancy provided by the input/output unit of layer 0 14 is achieved. The layer 1 16 circuit elements are active and used throughout the remainder of the overall integrated circuit formed of the two combined layers 14, 16 other than for the input/output circuit block. When signals pass into this input/output circuit block, they are routed via stack control circuitry 18 from layer 1 16 to layer 0 14, where they are processed by the non-defective input/output circuit block of layer 0 14. When output signals are generated by the input/output circuit block of layer 0 14, they are routed back up to layer 1 16 via stack control circuitry 20 and continue to be processed by the other circuit blocks within layer 1 16.

Figure 4:
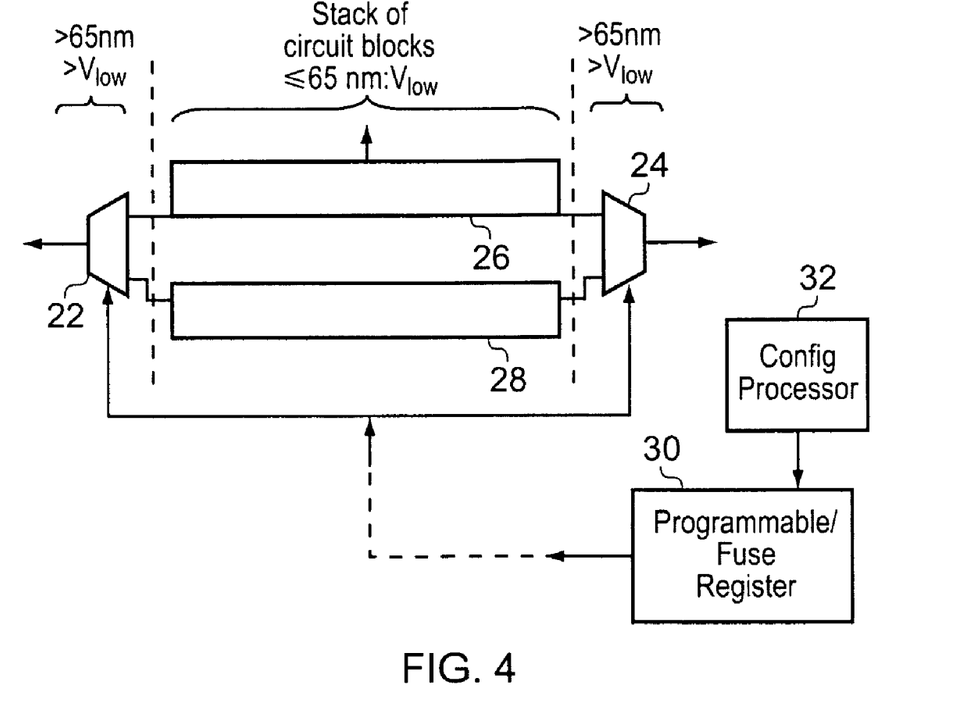
FIG. 4 illustrates one possible way in which the stack control circuitry may be configured and controlled.

FIG. 4 schematically illustrates a stack of circuit blocks and how the stack control circuitry might be controlled. In this embodiment the stack control circuitry is shown as an input multiplexer 22 and an output multiplexer 24. These multiplexers 22, 24 are provided in the form of robust switches, as previously discussed, and may be formed with components above a certain size, such as above a 65 nm process size, and operate at a voltage above that of the main circuit blocks which are operated at a low voltage for power saving reasons, but at the cost of reduced reliability. The main circuit blocks may also be formed of the smaller process size components, such as 65 nm and below component sizes.

The two multiplexers 22, 24 are switched together to select one of the two circuit blocks 26, 28 to be active within a given stack of circuit blocks. A bit within a programmable or fuse register 30 is used to provide the control signal to the multiplexers 22, 24. This bit may be dynamically calculated by a configuration processor 32 provided within the integrated circuit, or may be determined at manufacturing test time and programmed into a fuse register 30.

Figure 5:
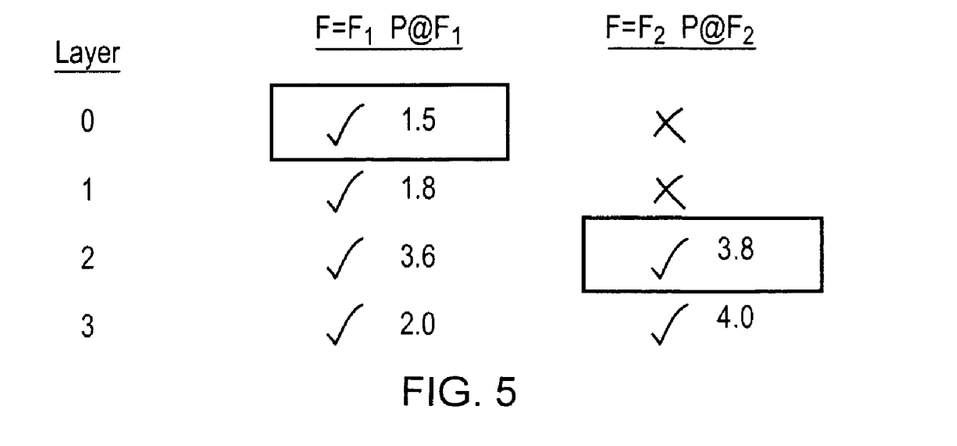
FIG. 5 illustrates how the stack control circuitry may dynamically select which circuit block is to be active.

FIG. 5 illustrates how the present techniques can be used to provide improved functionality beyond correcting for defective circuit blocks. In the example illustrated there are four layers of circuits. These four layers are capable of operating at two frequencies, namely $f_1$ and $f_2$. The power consumption at these two operating frequencies is determined for each of the circuit blocks within the stack which is having its data illustrated in FIG. 5. The first column indicates that all of the circuit blocks within all the layers do operate at the first frequency $f_1$. The second column indicates that the circuit blocks within layers 0 and 1 do not operate at the higher second frequency $f_2$, but that the circuit blocks in layers 2 and 3 do operate at this higher frequency. At each operating frequency, the circuit block having the lowest power consumption and which is capable of operating at that frequency is selected for use. Thus, at operating frequency $f_1$ the circuit block within layer 0 is selected as active by the stack selecting circuitry 18, 20, 22, 24, whereas at the second operating frequency $f_2$ the circuit block in layer 2 is selected as active.

Figure 6:
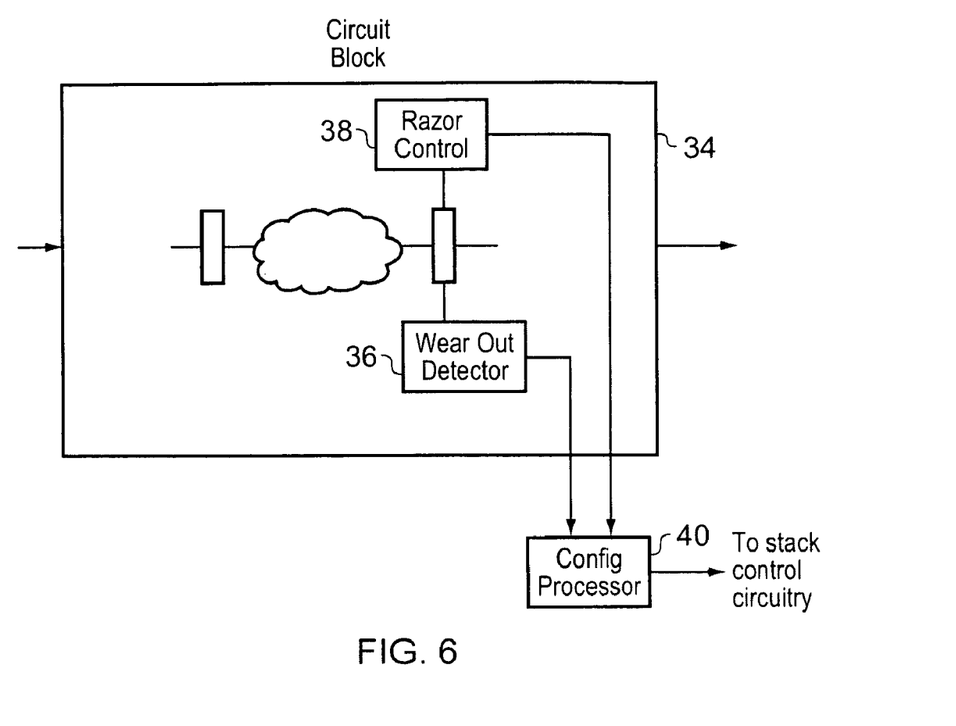
FIG. 6 illustrates how a circuit block may include detecting circuitry producing signals indicative of performance characteristics that are used to control the stack control circuitry.

FIG. 6 schematically illustrates how a circuit block 34 within a layer of circuits can include a wear out detector 36 and circuitry for performing timing speculation and error correction 38. The wear out detector circuitry 36 has a form similar to that described in U.S. patent application Ser. No. 11/878,882 filed 27 Jul. 2002. The content of this copending application is incorporated in its entirety herein via reference. The timing speculation and a correction circuitry 38 has a form of what is termed "Razor circuitry" as described in WO-A-2004/084072, the content of which is also incorporated herein in its entirety by a reference.

A configuration processor 40 which is responsible for generating control signals for the stack control circuitry is responsive to the signals generated by the wear out detector 36 and the Razor circuitry 38 which respectively indicate that the circuit block 34 is either approaching wear out or is suffering timing speculation errors to force generation of a control signal to the stack control circuitry which results in a different circuit block being selected as active. Thus, at run time instrumentation 36, 38 within the circuit block 34 directs which circuit block within a stack is selected as active. It will be appreciated that each of the circuit blocks within a stack will contain corresponding instrumentation 36, 38 and accordingly will be able to direct selection of an alternative circuit block if appropriate (e.g. it is failing or underperforming). The configuration processor 40 in this embodiment plays a central role in controlling the stack control circuitry 18, 20. This configuration processor 40 can be arranged to be integrated with the execution of the software controlling the system as a whole, e.g. the configuration processor 40 can operate under control of a software layer beneath an operating system level and responsible for controlling the stack control circuitry to provide fault tolerance.

Figure 7:
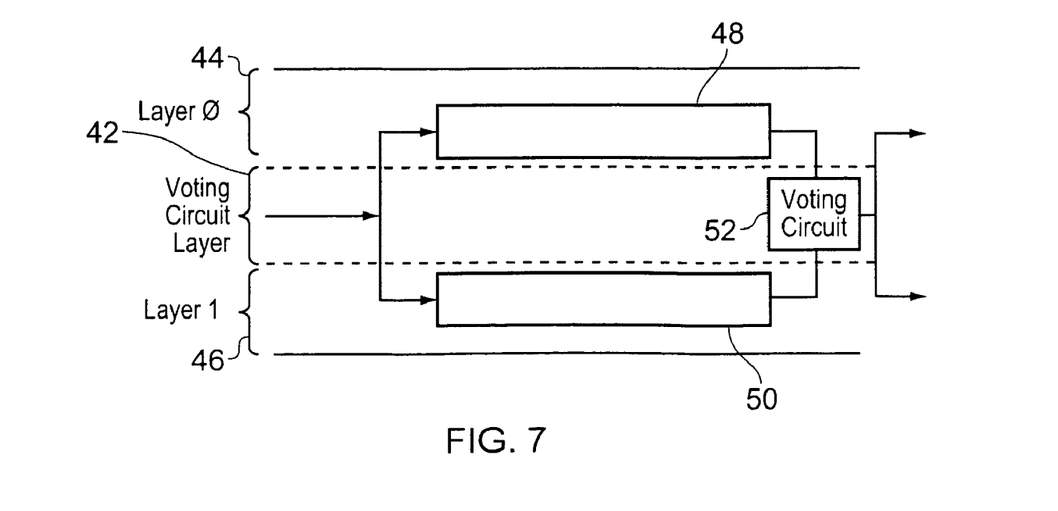
FIG. 7 illustrates a double modular redundant stack and one voting circuit arrangement.

FIG. 7 illustrates an example of a stack of circuit blocks arranged to provide double modular redundancy and with a voting circuit layer 42 interposed between the two layers of circuits 44, 46 containing the circuit blocks 48, 50 which are performing the processing desired. At the output of the circuit blocks 48, 50, a voting circuit 52 receives the respective output signals and generates the "moderated" output signal from the stack formed from those two circuit blocks 48, 50. The voting circuit 52 resolve any difference between the output signals generated by the respective circuit blocks 48, 50 by taking the signal that was generated more quickly to have the correct value as incorrect operation is well correlated with slower operation.

Figure 8:
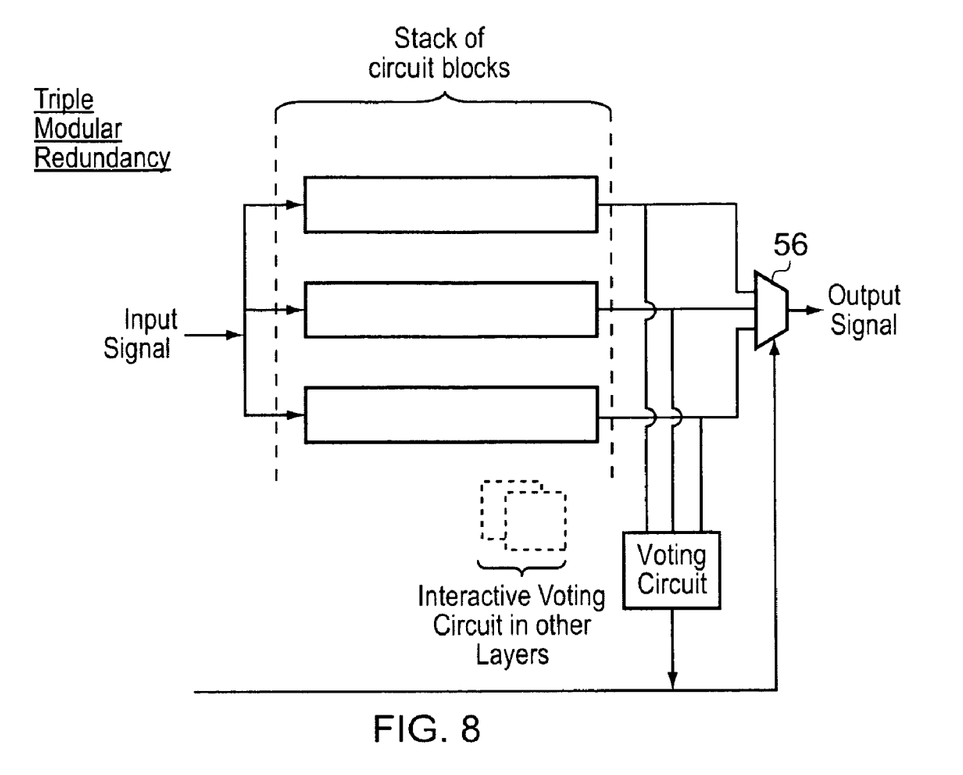
FIG. 8 illustrates a triple modular redundant stack and another voting circuit arrangement.

FIG. 8 schematically illustrates a stack of circuit blocks providing triple modular redundancy. In this example, a voting circuit 54 within one of the layers of circuits is active and directs selection by a multiplexer 56 of the output signal to be driven from the stack. The voting circuit 54 can employ majority voting such that an incorrect output signals produced by one of the circuit blocks will be overruled by the correct outward signal being produced by the two remaining circuit blocks. Voting circuitry 54 is provided within each layer of circuits but is only active within one layer. Providing the voting circuitry 54 within each layer has the advantage that the layers of circuits are identical and can be produced with the same masks.

Figure 9:
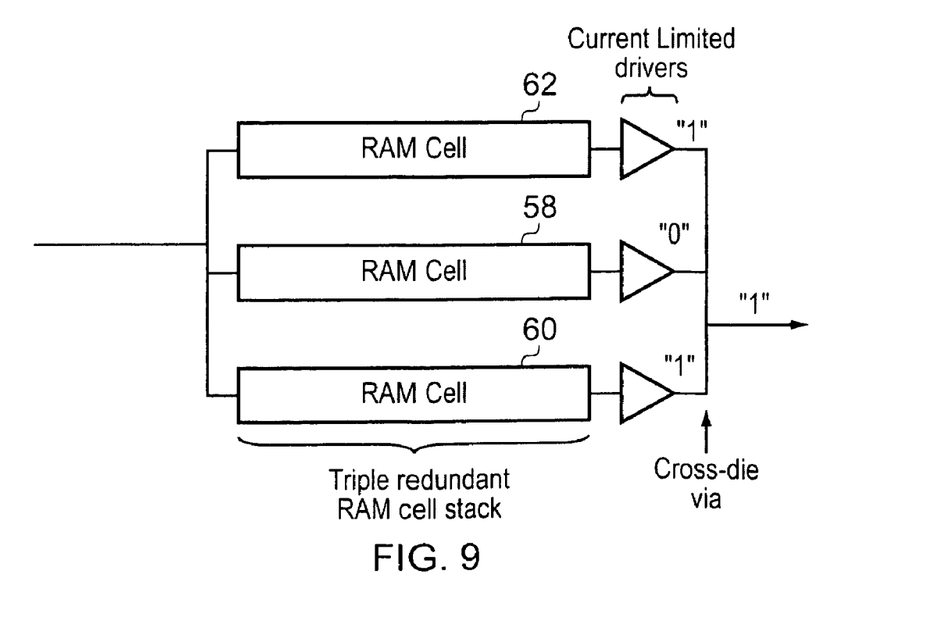
FIG. 9 illustrates a triple modular redundant stack of memory cells and a further voting arrangement.

FIG. 9 illustrates a technique of triple modular redundancy being used in relation to state holding elements in the form of RAM cells. This technique provides a degree of resistance to soft errors for the RAM cells such that, for example, if a temporary disturbance flips the bit value being stored by RAM cell 58, then the correct bit values being stored within the RAM cells 60 and 62 will overrule (out vote) this incorrect value. In this example embodiment the, voting circuitry is provided in the form of current limited drivers at the output of each of the RAM cells with these drivers being connected to a common cross-die via. In operation, the two current limited drivers driving the correct output signal value will overpower the one current limited driver seeking to drive the incorrect signal value, such that the correct signal value will be produced by the stack of RAM cells 58, 60, 62. The correct value is also driven back into the RAM cell 58 which has been subject to the soft error and thereby corrects that soft error.

Figure 10:
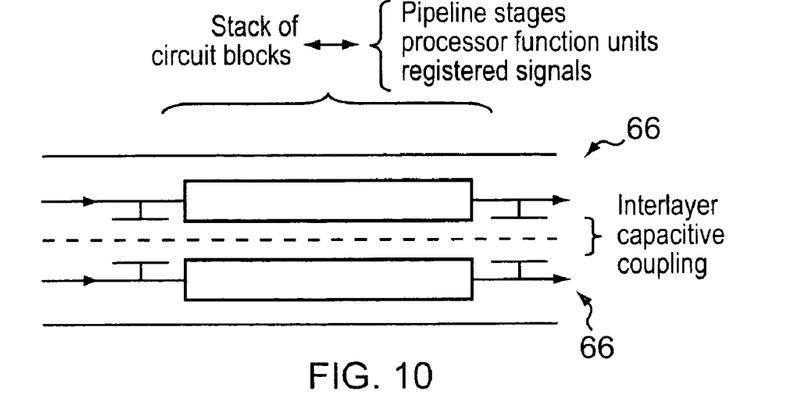
FIG. 10 illustrates capacitive coupling between circuit blocks.

FIG. 10 illustrates how layers of circuits 64, 66 can be joined together with inter-layer capacitive coupling. Such coupling will be relatively slow, but can be conveniently provided and fabricated into the layers of circuits.

Figure 11:
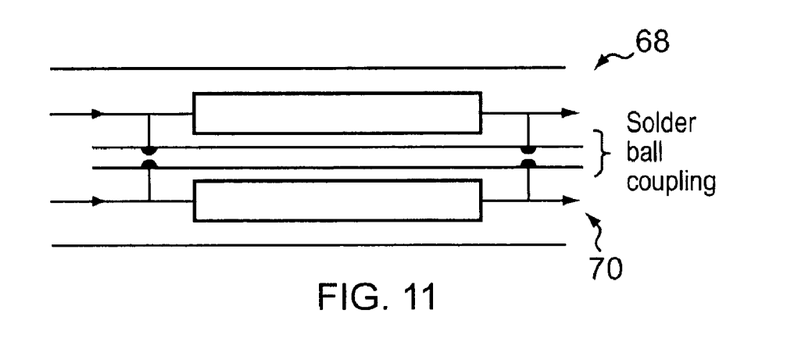
FIG. 11 illustrates the use of solder bump coupling between circuit blocks.

FIG. 11 illustrates inter layer coupling provided by solder bumps on the face of the layers of circuits 68, 70 (which are heated to fuse the bumps). Such solder bump coupling is more suited to large scale circuit blocks, such as system components within a system-on-chip integrated circuit.

Figure 12:
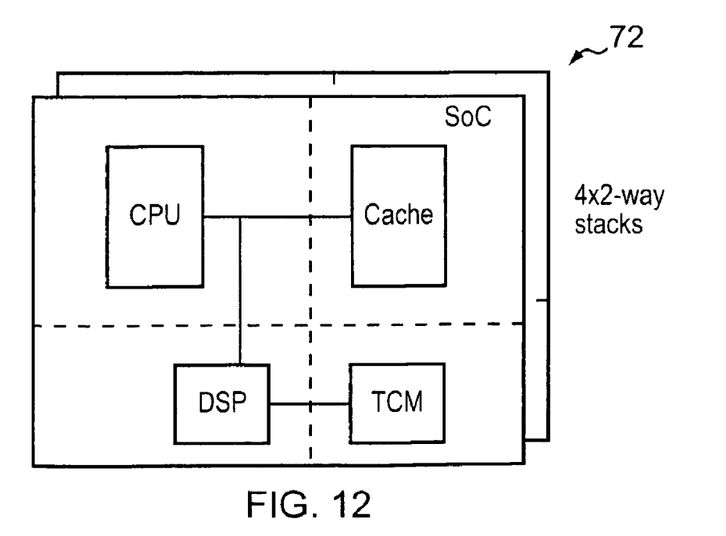
FIG. 12 illustrates how circuit blocks within a system-on-chip integrated circuit may be formed as system components.

FIG. 12 illustrates how an integrated circuit 72 can be formed of multiple circuit layers each comprising a system-on-chip design in itself. The different system components, namely a CPU, a DSP, a cache and a tightly coupled memory are treated separately and formed into separate stacks which provide redundancy with an underlying or overlying corresponding circuit block of a different layer of circuits. In this example, four two-way stacks of circuit blocks are provided. Thus, for example, the overall integrated circuit 72 includes two CPU components each providing redundancy for a failure in the other.

Figure 13:
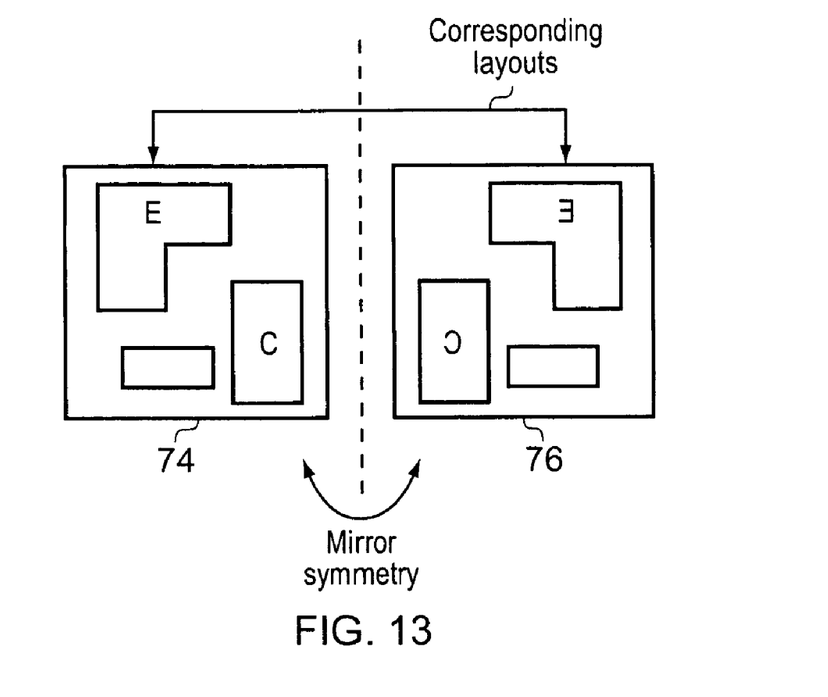
FIG. 13 illustrates how two layers of circuits having mirror symmetry have a corresponding layout and may be superimposed.
Figure 14:
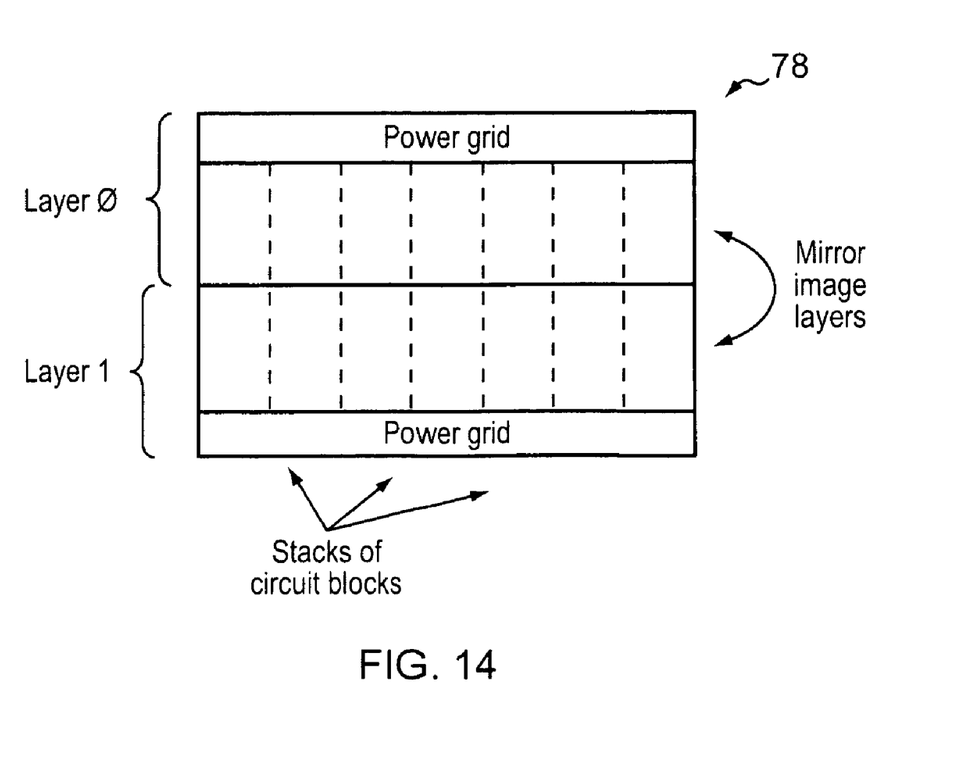
FIG. 14 illustrates the section through the superimposed layers of circuits of FIG. 13.

FIG. 13 illustrates how two circuit layers 74, 76 may be formed as mirror images of one another. Such mirror image circuit designs can be readily produced by flipping the lithographic masks used in the manufacturing process. Such mirror image layouts are corresponding layouts that can be joined face-to-face as illustrated in FIG. 14. Furthermore, such face-to-face joining of mirror image corresponding layouts is advantageous in some circumstances as it allows the power grids to be formed on the outer faces of the overall combined integrated circuit 78 in a manner providing convenient access to those power grids for packaging reasons.

Figure 15:
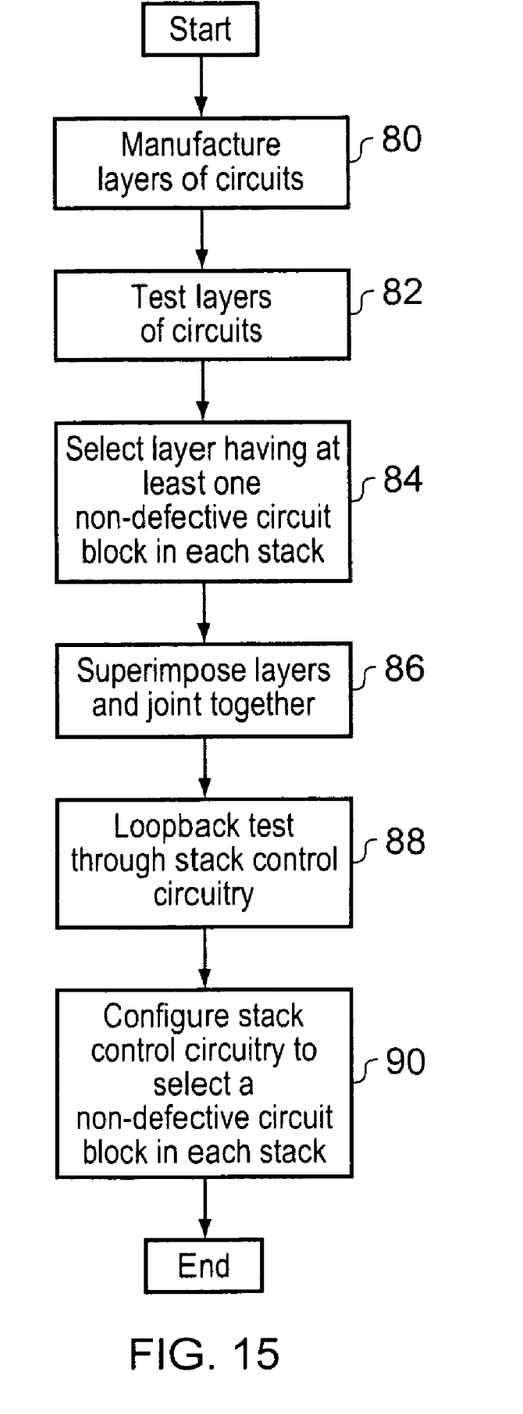
FIG. 15 is a flow diagram schematically illustrating a manufacturing process for an integrated circuit comprising multiple layers of circuits.

FIG. 15 is a flow diagram schematically illustrating the manufacturing of integrated circuits according to the present techniques. At step 80, individual layers of circuits are manufactured using conventional techniques. These layers may include mirror image layers as discussed in relation to FIGS. 13 and 14, or may be in the form of more directly corresponding layers as illustrated in FIG. 2.

At step 82, the layers of circuits which are manufactured are subject to manufacturing tests. At step 84, sets of circuit layers are selected to provide redundancy for one another and to correct for defects in the manufacture by selecting the set such that within each stack of circuit blocks there is at least one non-defective circuit block. This is the type of relationship illustrated in FIG. 2, i.e. at least one non-defective signal component is present within each stack of system components.

At step 86 the circuit layers are superimposed and joined together, such as by the use cross-die vias, solder bumps or capacitive coupling. At step 88, loopback testing is used to confirm that the stack control circuitry is properly connected and properly operating. Such loopback testing involves driving a known signal value with one of the circuit layers through the stack control circuitry and the inter-layer link to another of the layers of circuits and then reading that signal value to ensure that it has the appropriate value indicating the proper connection. Thus, the individual stack control circuits can be verified as operating correctly once the layers of circuits have been joined together.

At step 90 the stack control circuitry is configured to select a non-effective circuit block within each stack as the default circuit block to use within that stack. Thus, a fully operational integrated circuit formed of multiple layers of circuits each containing at least one defective circuit block can be formed. Thus, the layers of circuits which would otherwise be scrap can be reused and produce working integrated circuits.

It will be appreciated that some of the layers of circuits may not contain any defective circuit blocks and may nevertheless be joined together to provide redundancy, such as to provide double or triple modular redundancy in highly safely critical environments. Furthermore, a non-defective layer of circuits at manufacturing time may be subject to wear out during use, particularly with smaller geometry integrated circuits wear out is a more significant issue, and accordingly the redundancy provided by the present technique can provide a longer field service life by substituting the worn out circuit block. It is also possible that different circuit blocks within different layers whilst functioning may have differing operating characteristics more suited to particular modes of operation and the stack control circuitry can be used to switch between the circuit blocks and match the desired characteristics of the mode in use. Parallel operation may also be desirable in some circumstances with multiple circuit blocks being concurrently active not to provide redundancy, but to provide increased functionality. For example, it may be desired to increase the memory size available in some modes by activated all the memory blocks within a stack whereas in other modes power might be saved by only activating one of the memory blocks within a stack.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit having a major plane, said integrated circuit comprising:
   a plurality of layers of circuits, said plurality of layers of circuits sharing a corresponding layout of a plurality circuit blocks over at least a portion of said layer, said plurality of layers being superimposed such that over said portions are formed a plurality of stacks of circuit blocks extending perpendicular to said major plane; wherein
   each of said plurality of stacks is coupled to stack control circuitry configured to receive one or more input signals to said stack, to supply said one or more input signals to one or more active circuit blocks within said stack, to receive output signals of said one or more active circuit blocks and to form one or more output signals of said stack.

2. An integrated circuit as claimed in claim 1, wherein said stack control circuitry is responsive to one or more selecting signals indicative of which one of said plurality of circuit blocks within said stack is selected to be an active circuit block, with a remainder of said plurality of circuit block being inactive, to route said one of more input signals to said stack to said active circuit block and to route one or more output signals of said active circuit block to form said one of more output signals of said stack.

3. An integrated circuit as claimed in claim 2, wherein said one or more selecting signals select as said active circuit block from among said plurality of circuit blocks a circuit block having one or more selection characteristics.

4. An integrated circuit as claimed in claim 3, wherein said one or more selection characteristics comprise one or more of:
   said circuit block is non-defective;
   said circuit block has a power consumption less than a predetermined power consumption level;
   said circuit block has a power consumption less than said remainder of said plurality of circuit blocks;
   said circuit block has a speed of operation greater than a predetermined speed level; and
   said circuit block has a speed of operation greater than said remainder of said plurality of circuit blocks.

5. An integrated circuit as claimed in claim 2, wherein said one or more selecting signals are determined as part of manufacturing test operations performed upon said integrated circuit.

6. An integrated circuit as claimed in claim 5, wherein said one or more selecting signals are one of:
   programmed in fuses; and
   stored in a configuration register.

7. An integrated circuit as claimed in claim 2, wherein said one or more selecting signals are dynamically determined during normal operation of said integrated circuit.

8. An integrated circuit as claimed in claim 7, wherein a wear out detecting circuit coupled to said active circuit block and responsive to signal characteristics of said active circuit block indicative wear out is used to dynamically determine said one or more selecting signals such that a different circuit block is selected as said active circuit block.

9. An integrated circuit as claimed in claim 7, wherein said circuit blocks include error recovery circuits and levels of use of said error recovery circuits are used to dynamically determine said one or more selecting signals such that said active circuit block has a reduced likelihood of failure.

10. An integrated circuit as claimed in claim 1, wherein said stack control circuitry is formed of components having a size selected such that said stack control circuitry is statistically less likely to be defective than said circuit blocks.

11. An integrated circuit as claimed in claim 1, wherein said stack control circuitry provides multiple modular redundancy within said stack with a plurality of said circuit blocks being active circuit blocks and receiving said one or more input signals to said stack and said stack control circuitry being responsive to differences between said one or more output signals of said plurality of active circuit blocks to identify a defective circuit block among said plurality of active circuit blocks.

12. An integrated circuit as claimed in claim 11, wherein said stack control circuitry performs a majority voting selection between said one or more output signals of respective ones of said plurality of active circuit blocks to form said one or more output signals of said stack.

13. An integrated circuit as claimed in claim 12, wherein said stack control circuitry comprises current limited drivers for said one or more output signals from respective circuit blocks within said stack such that a driver from a circuit block driving a signal of said one or more output signals to a value different from a value of said signal being driven by a majority of said circuit blocks within said stack will be overpowered.

14. An integrated circuit as claimed in claim 12, wherein said stack control circuitry includes voting circuitry, said voting circuitry being located in one of:
within a voting circuit layer disposed between said layers of circuits sharing a corresponding layout; and
within each of said layers of circuits with only one instance of said voting circuitry being active for each stack.

15. An integrated circuit as claimed in claim 11, wherein said stack comprises one of:
three substantially identical circuit blocks and said stack selecting circuitry provides triple modular redundancy; and
two substantially identical circuit blocks and said stack selecting circuitry provides double modular redundancy with a slower circuit block being treated as defective when any of said one or more output of respective circuit block are unequal.

16. An integrated circuit as claimed in claim 12, wherein at least some state holding circuit elements within said layers of circuits are separated in to different stacks with majority voting selection being performed between output signals of said state holding elements within a stack such that a soft error within one of said state holding elements is masked.

17. An integrated circuit as claimed in claim 1, wherein circuit blocks of different layers within said stack are linked with one or more of:
cross-die vias;
solder bumps; and
capacitive coupling.

18. An integrated circuit as claimed in claim 1, wherein said circuit blocks forming said stack comprise one or more of:
circuits between registered signals within a layer of circuits;
circuits forming a processing pipeline stage;
circuits forming a function unit within a processor; and
circuits forming a system component within a system-on-chip integrated circuit.

19. An integrated circuit as claimed in claim 1, wherein said circuit blocks within said stack include clock speculation and error correction circuits such that timing delays and timing errors due to increased signal routing delays are reduced.

20. An integrated circuit as claimed in claim 1, wherein at least one circuit block of at least one stack has a manufacturing defective detected during manufacturing test and making said circuit block inoperative.

21. An integrated circuit as claimed in claim 1, comprising two layers of circuits being mirror images and superimposed face-to-face such that said stacks have mirror symmetry.

22. An integrated circuit having a major plane, said integrated circuit comprising:
a plurality of layers of circuits, said plurality of layers of circuits sharing a corresponding layout of a plurality circuit block means over at least a portion of said layer, said plurality of layers being superimposed such that over said portions are formed a plurality of stacks of circuit block means extending perpendicular to said major plane; wherein
each of said plurality of stacks is coupled to stack control circuit means for receiving one or more input signals to said stack, supplying said one or more input signals to one or more active circuit blocks within said stack, receiving output signals of said one or more active circuit blocks and forming one or more output signals of said stack.

23. A method of forming an integrated circuit having a major plane, said method comprising the steps of:
superimposing a plurality of layers of circuits, said plurality of layers of circuits sharing a corresponding layout of a plurality circuit blocks over at least a portion of said layer, such that over said portions are formed a plurality of stacks of circuit blocks extending perpendicular to said major plane; and
providing stack control circuit coupled to said stack to receive one or more input signals to said stack, to supply said one or more input signals to one or more active circuit blocks within said stack, to receive output signals of said one or more active circuit blocks and to form one or more output signals of said stack.

24. A method as claimed in claim 23, comprising performing one or more manufacturing tests upon said layers of circuits and wherein said layers are selected such that each stack includes at least one circuit block that has not failed a manufacturing test.

25. A method as claimed in claim 23, comprising performing loopback testing upon said stack control circuitry during manufacturing test to confirm said one or more input signals and said one or more output signals can be passed between layers of circuitry.

* * * * *